(12) United States Patent
Kinyua

(10) Patent No.: US 7,432,841 B1
(45) Date of Patent: Oct. 7, 2008

(54) DELTA-SIGMA ANALOG-TO-DIGITAL CONVERTER WITH PIPELINED MULTI-BIT QUANTIZATION

(75) Inventor: Martin Kithinji Kinyua, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/807,504

(22) Filed: May 29, 2007

(51) Int. Cl.
H03M 3/00 (2006.01)
(52) U.S. Cl. .................................... 341/143; 341/155
(58) Field of Classification Search ................ 341/143, 341/155
See application file for complete search history.

(56) References Cited

U.S. PATENT DOCUMENTS

| | | | | |
|---|---|---|---|---|
| 5,153,593 | A * | 10/1992 | Walden et al. | 341/143 |
| 5,982,313 | A * | 11/1999 | Brooks et al. | 341/143 |
| 6,300,890 | B1 * | 10/2001 | Okuda et al. | 341/143 |
| 6,323,794 | B1 * | 11/2001 | Okuda et al. | 341/143 |

OTHER PUBLICATIONS

Brooks, T. L., et al., "A 16b ΣΔ Pipeline ADC with 2.5MHz Output Data-Rate," 1997 IEEE International Solid-State Circuits Conference, Feb. 7, 1997, pp. 208-209, 458, IEEE.

Brooks, T. L., et al., "A Cascaded Sigma-Delta Pipeline A/D Converter with 1.25 MHz Signal Bandwidth and 89 dB SNR," IEEE Journal of Solid-State Circuits, Dec. 1997, pp. 1896-1906, vol. 32, No. 12, IEEE.

Staszewski, R. B., et al., "Digitally Controlled Oscillator (DCO)-Based Architecture for RF Frequency Synthesis in a Deep-Submicrometer CMOS Process," IEEE Transactions on Circuits and Systems—II: Analog and Digital Signal Processing, Nov. 2003, pp. 815-828, vol. 50, No. 11, IEEE.

Bosi, A., et al., "An 80MHz 4x Oversampled Cascaded ΣΔ-Pipelined ADC with 75dB DR and 87dB SFDR," IEEE International Solid-State Circuits Conference, 2005, pp. 174-175, 591, IEEE.

* cited by examiner

*Primary Examiner*—Khai M Nguyen
(74) *Attorney, Agent, or Firm*—Ronald O. Neerings; Wade James Brady, III; Frederick J. Telecky, Jr.

(57) ABSTRACT

A cascaded analog-to-digital converter includes a first stage delta-sigma modulator to quantize an input signal and produce a first quantization error signal. A second, coupled multi-stage delta-sigma modulator quantizes less significant bits of the input signal, wherein a first quantization stage is coupled to the first quantization error signal to quantize the next most significant bits of the input signal and produce a second quantization error signal. A second quantization stage is coupled to the second quantization error signal to quantize the least significant bits of the input signal and produce a third quantization error signal. A noise-shaping filter is coupled to the third quantization error signal, the output of which is subtracted from the first quantization error signal to produce said input of the first quantization stage.

18 Claims, 5 Drawing Sheets

DELTA-SIGMA ANALOG-TO-DIGITAL CONVERTER WITH PIPELINED MULTI-BIT QUANTIZATION

TECHNICAL FIELD

This invention relates generally to an apparatus and method for producing a digital sampled-data sequence for a signal, and more particularly, to an apparatus and method for implementing a high resolution analog-to-digital converter with delta-sigma modulation noise shaping and pipelined quantization.

BACKGROUND

Corresponding to the increased operating frequency and complexity of electronic devices, for example, with high-definition television (HDTV), there is a need for analog-to-digital converters ("ADCs") to operate at higher sampling rates as well as provide greater conversion resolution. Typically, an ADC that is capable of operating at sufficiently high sampling rates must trade-off conversion resolution, while a high conversion resolution ADC usually is not capable of operating at a high sampling rate.

Delta-sigma modulators generally employ noise-shaping and over-sampling techniques to perform analog-to-digital conversion ("A/D conversion") at relatively high resolution for signals of modest bandwidth as described in the book by S. R. Norsworthy, R. Schreier, and G. Temes, entitled "Delta-Sigma Data Converters," IEEE Press, January 1997. The main advantages of such modulators over alternative A/D conversion schemes are the use of analog circuits with precision much less than the resolution of the overall converter, compatibility with advanced nanometer-scaled CMOS technology, and the ability to trade resolution in time for resolution in amplitude by digital decimation and low-pass filtering.

For a given signal bandwidth, design options available to attain high resolution are increasing the modulator order and/or employing multi-bit quantization. Arbitrarily increasing the order of the modulator in single-stage loops may lead to modulator instability. The stability problem can be mitigated by cascading stable lower order stages that operate in cooperation to attain higher order "Multi-stAge noise-SHaping" ("MASH") noise shaping. On the other hand, utilizing multi-bit quantizers yields approximately a 6 dB improvement in signal-to-noise ratio (SNR) for each additional bit, as described by T. Leslie and B. Singh in the paper entitled "An Improved Sigma-Delta Modulator Architecture," in the Proceedings of the IEEE International Symposium on Circuits and Systems, pp. 372-375, 1990, which is hereby referenced and incorporated herein. This means increased resolution can be obtained without increasing the over-sampling ratio. Equivalently, a multi-bit modulator can achieve a resolution comparable to that of a similar single-bit modulator at a lower sampling rate. This performance improvement can be a significant advantage in applications requiring wide conversion bandwidth. However, problems persist in implementing multi-bit quantizers beyond a few bits within a delta-sigma loop because they usually must employ a "flash-type" ADC, i.e., they must perform rapid conversion within one clock cycle using arrayed flash type comparators, because conversion latency cannot be tolerated in the delta-sigma loop, which may lead to instability. The limitation of this approach is that complexity must grow exponentially with resolution because flash type component count is proportional to $2^N$, where N is the number of bits of converter resolution.

Turning now to FIG. 1, illustrated is a block diagram of a delta-sigma modulator 100 of the prior art with an input X(n), representing an analog input signal at cycle n, and an output digital word Y(n) at cycle n. The delta-sigma modulator 100 is typically operated periodically to produce the output sequence Y(n), and can be implemented using digital signal processing techniques. The input signal X(n) and the output of the digital-to-analog converter (a "DAC") 140 are subtracted in adder 110, and the cycle-to-cycle result is summed in block 120. Block 120, illustrated in the figure with Z-transform notation for a sampled-data system, represents a summing process, i.e., block 120 is an analog "integrator." Block 120 typically executes the equation $$L(n+1)=L(n)+U(n),$$

where U(n) and L(n) are, respectively, the input and output of the integrator at cycle n, and L(n+1) is the output of the integrator at cycle n+1. Quantizer 130 reduces the bit width of the output word of the delta-sigma modulator to produce the output sequence Y(n), each word of which may only be a single bit. DAC element 140 executes the equation $$W(n)=Y(n-1),$$

where W(n) is the output from the DAC element at cycle n, and Y(n−1) is the input to the element at the previous cycle. A DAC element is implemented by converting the input digital word to its equivalent analog representation. The delta-sigma modulator illustrated in FIG. 1 is thus an analog processing circuit that produces a sequence of output words Y(n) that assume values with average value equal to the average value of the input signal X(n).

A second-order delta-sigma modulator of the prior art is illustrated in the block diagram in FIG. 2, including the two integrators 215 and 220. This modulator is referred to as a second-order modulator because it includes two integrators (or "integration stages"). The output word Y(n) in this design may be quantized to a bit width of one, and alternately assume the values +1 and −1 after processing by quantizer 225.

Modulators with higher orders of integration come with increased cost as measured by indicators such as die area, gate count, signal processing delay, and power dissipation. Nonetheless, modulators of higher order, such as the modulator illustrated in FIG. 2, allow the output signal to track the input signal with improved accuracy.

Leslie and Singh describe in the paper previously cited, as illustrated in FIG. 3, a second-order noise-shaping analog-to-digital converter with single-bit feedback in a multi-loop modulator. In this multi-bit quantizing arrangement, only the most significant bit is fed back, thereby requiring only a single bit digital-to-analog converter. The need to calibrate a multi-bit digital-to-analog converter is thereby avoided. Nonetheless, a limitation of Leslie and Singh is that no additional noise-shaping is provided for the m-bit quantization error.

T. Brooks, et al., in the paper entitled, "A 16b Sigma-Delta Pipeline ADC with 2.5 MHz Output Data-Rate," International Solid State Circuits Conference, February 1997, pp. 208-209, ("Brooks") which is hereby referenced and incorporated herein, describe an analog-to-digital converter employing delta-sigma modulation using pipelined analog-to-digital conversion techniques with oversampling to achieve rapid signal conversion. The structure of an ADC as described by Brooks employing an internal k-bit flash ADC is illustrated in FIG. 4. Brooks' architecture is limited because it requires complex dynamic element matching ("DEM") in a k-bit DAC incorporated within the delta-sigma loop.

Recognizing that applications of delta-sigma modulators serve large, competitive markets, many serving portable applications operable from battery power, a low-cost delta-sigma modulator, particularly one that consumes low-power, provides fast and accurate multi-bit conversion of an analog signal into a digital format, would provide a competitive advantage. Thus, what is needed in the art is a delta-sigma modulator that can produce a high-frequency sequence of binary words with high accuracy and minimal signal processing. Further, a need exists for an improved delta-sigma modulator that can advantageously be produced in an integrated circuit with low cost and with fast signal-processing speed, and which has less drain on the battery system for portable devices than devices that are produced with existing technology.

SUMMARY OF THE INVENTION

Embodiments of the present invention achieve technical advantages as an analog-to-digital converter for high accuracy conversion of an analog signal into a multi-bit digital signal utilizing a delta-sigma modulator.

A preferred embodiment cascades first stage delta-sigma modulation with pipelined noise-shaped second stage quantization, increasing thereby converter performance capability in terms of bandwidth and resolution. A topology is therefore introduced capable of combining the advantages of high-order noise-shaping and pipelined quantization to achieve high resolution at wide bandwidths. This is accomplished by performing cascaded multi-bit quantization in a path that can tolerate pipeline conversion latency, as opposed to performing multi-bit quantization in a classical delta-sigma loop.

In a preferred embodiment, the analog-to-digital converter comprises a first delta-sigma modulator to quantize the most significant bit of the input signal and produce a first quantization error signal. The first delta-sigma modulator includes a one-bit analog-to-digital converter in a feedforward path, and a one-bit digital-to-analog converter in a feedback path.

In a preferred embodiment, the analog-to-digital converter further includes a second, multi-stage delta-sigma modulator that quantizes less significant bits of the input signal. In a preferred embodiment, the second delta-sigma modulator includes a first quantization stage coupled to a difference of the first quantization error signal and a second quantization error signal to quantize next most significant bit(s) of the input signal and produce a third quantization error signal representing a difference between an input and an output of the first quantization stage. In a preferred embodiment, the second delta-sigma modulator includes a second quantization stage with an input coupled to the third quantization error signal to quantize least significant bit(s) of the input signal and produce the second quantization error signal. The second quantization error signal represents a difference between the input and an output of the second quantization stage. In a preferred embodiment, the second quantization stage further includes a first noise-shaping filter coupled to the third quantization error signal. In a preferred embodiment, the output of the first noise-shaping filter is subtracted from the first quantization error signal to produce the input of the first quantization stage.

In a further embodiment, the second delta sigma modulator includes pipelined quantization stages. In a preferred embodiment, the most significant bit produced by the first delta sigma modulator and the less significant bits produced by the second, multi-stage delta sigma modulator are added in a first combiner to produce the output signal. In a preferred embodiment, the less significant bits are filtered in a second noise-shaping filter prior to being added to the most significant bit in the first combiner. The third quantization error signal is filtered in a third noise-shaping filter prior to being coupled to the second quantization stage. The next most significant bit(s) produced in the first quantization stage and the least significant bit(s) produced in the second quantization stage are combined in a second combiner to produce the less significant bits produced by the second multi-stage delta-sigma modulator. The least significant bit(s) quantized by the second quantization stage are filtered by a fourth noise-shaping filter prior to combining them in the second combiner. In a preferred embodiment, the filtering function in the third noise-shaping filter and the filtering function in the fourth noise-shaping filter are reciprocal functions. In a further preferred embodiment, the filtering function of the third noise-shaping filter is a constant, the filtering function of the fourth noise-shaping filter is the reciprocal of the constant, and the first noise-shaping filter is filtering function $z^{-1}$ divided by the constant.

Another exemplary embodiment of the invention provides a method of forming an analog-to-digital converter that can produce an output signal from an input signal with minimal signal processing delay. In a preferred embodiment, the method includes quantizing the most significant bit of the input signal in a first delta-sigma modulator and producing therein a first quantization error signal. The method includes forming the first delta-sigma modulator with a one-bit analog-to-digital converter in a feedforward path, and a one-bit digital-to-analog converter in a feedback path.

In a preferred embodiment, the method further includes quantizing less significant bits of the input signal employing a second, multi-stage delta-sigma modulator. In a preferred embodiment, the method further includes coupling a first quantization stage of the second, multi-stage delta-sigma modulator to a difference of the first quantization error signal and a second quantization error signal, and quantizing the next most significant bit(s) of the input signal therefrom. The method further includes producing a third quantization error signal representing a difference between an input and an output of the first quantization stage of the second, multi-stage delta-sigma modulator. The method further includes coupling a second quantization stage of the second, multi-stage delta-sigma modulator to the third quantization error signal, quantizing the least significant bit(s) of the input signal, and producing the second quantization error signal. The second quantization error signal represents a difference between the input and an output of the second quantization stage of the second, multi-stage delta-sigma modulator. In a preferred embodiment, the method further includes coupling a first noise-shaping filter in the second quantization stage to the second quantization error signal. In a preferred embodiment, the method includes subtracting an output of the first noise-shaping filter from the first quantization error signal to produce the input of the first quantization stage.

In a preferred embodiment, the method includes using pipelined quantization stages in the second, multi-stage delta-sigma modulator. The method further includes adding the most significant bit produced by the first delta-sigma modulator and the less significant bits produced by the second multi-stage delta-sigma modulator to produce the output signal. The method further includes filtering the less significant bits in a second noise-shaping filter prior to adding them to the most significant bit. The method further includes filtering the third quantization error signal in a third noise-shaping filter prior to coupling the third quantization error signal to the second quantization stage. The method further includes combining the next most significant bits produced in the first quantization stage and the least significant bits produced in the second quantization stage to produce the less significant bits produced by the second, multi-stage delta-sigma modulator. The method further includes filtering the least significant bits quantized by the second quantization stage by a fourth noise-shaping filter prior to combining them. In a preferred embodiment, the method further includes using reciprocal functions for the filtering function in the third noise-shaping filter and the filtering function in the fourth noise-shaping filter. In a further preferred embodiment, the method includes using a constant for the filtering function of the third noise-shaping filter, the reciprocal of the constant for the filtering function of the fourth noise-shaping filter, and the filtering function $z^{-1}$ divided by the constant for the first noise-shaping filter.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely an apparatus and method using a delta-sigma modulator that can produce a digital output signal with high-resolution from an analog input signal with minimal die area, low cost, and low power dissipation. However, the use of this specific context is for illustrative purposes and does not limit the scope of the invention or the appended claims.

Figure 1:
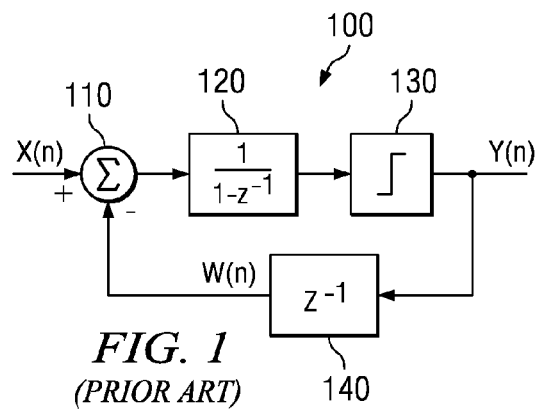
FIG. 1 illustrates a block diagram of a first-order delta-sigma modulator of the prior art.
Figure 2:
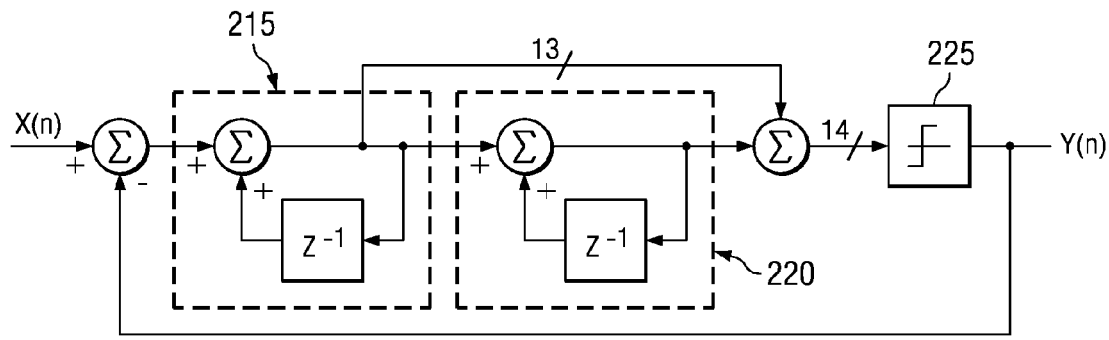
FIG. 2 illustrates a block diagram of second-order digital delta-sigma modulator of the prior art.
Figure 3:
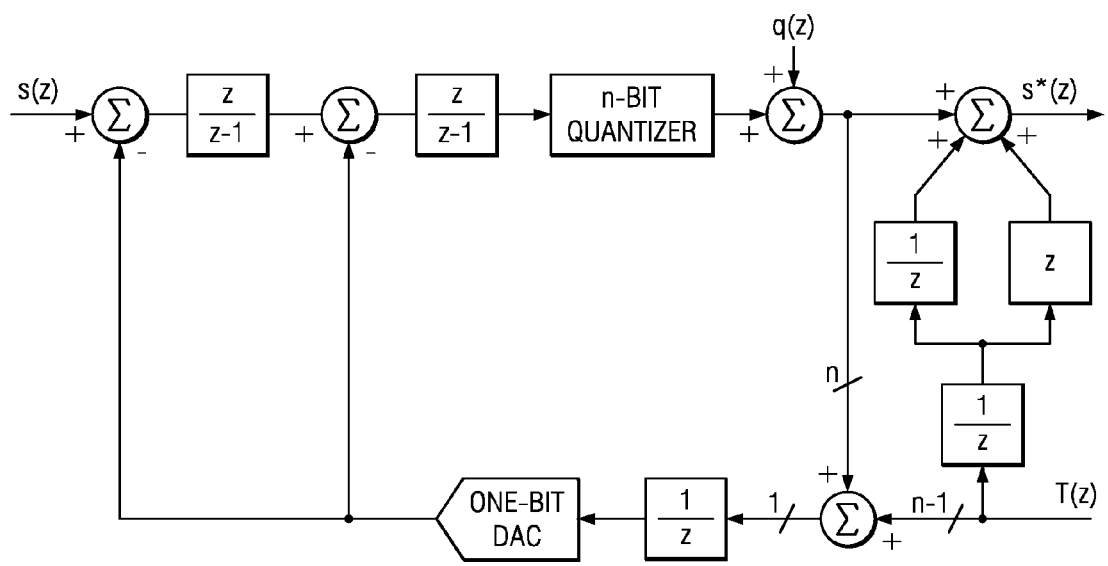
FIG. 3 illustrates a second-order noise-shaping analog-to-digital converter with single-bit feedback in a multi-loop modulator of the prior art.
Figure 4:
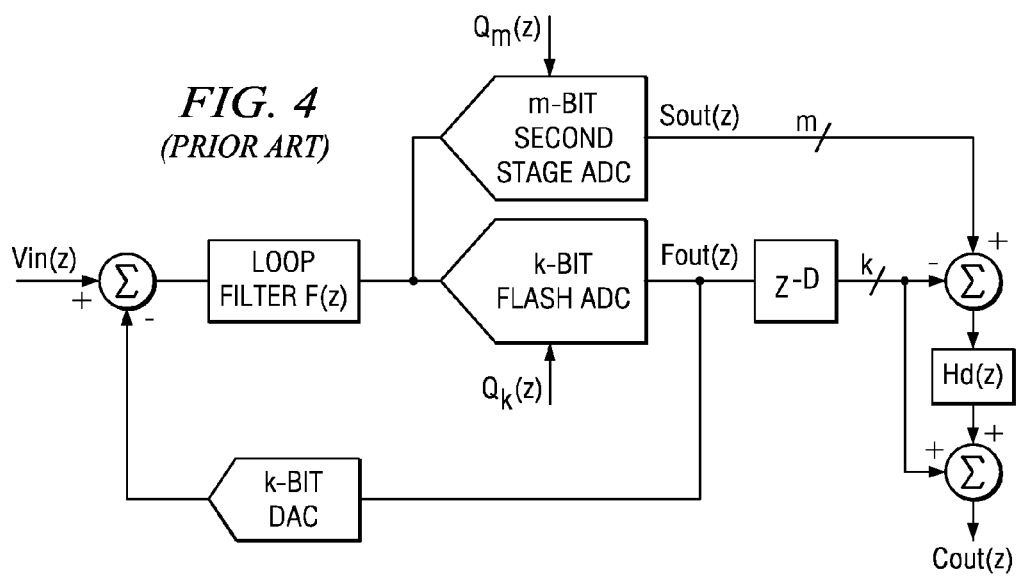
FIG. 4 illustrates an analog-to-digital converter employing delta-sigma modulation and pipelined analog-to-digital conversion of the prior art.
Figure 5:
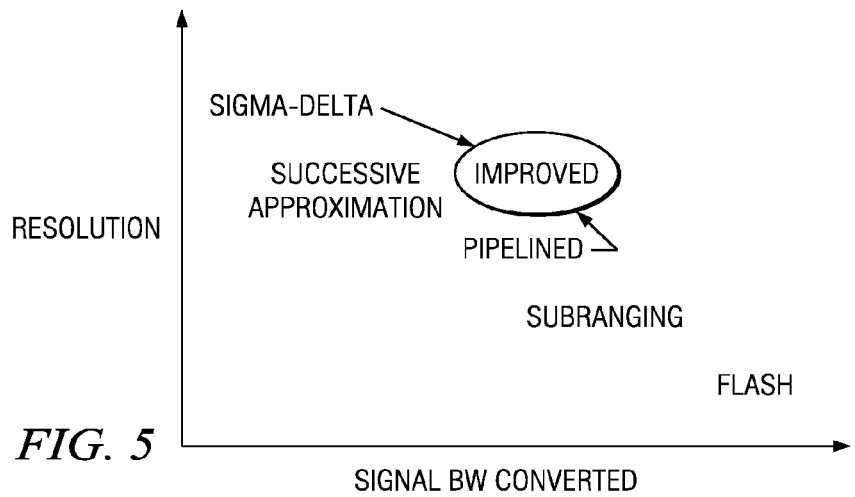
FIG. 5 illustrates a graphical representation of several known analog-to-digital conversion technologies.

Turning now to FIG. 5, illustrated is a graphical representation of several known analog-to-digital conversion technologies, showing the rate of signal conversion ("Signal BW (bandwidth) converted") on the horizontal axis, and resolution (conversion accuracy, as represented by the number of bits in the converted signal) on the vertical axis. The challenge of providing rapid signal conversion with high conversion resolution in an economical and manufacturable product is evident in this graph. As illustrated in FIG. 5, the invention seeks to improve A/D conversion by combining delta-sigma modulation with pipelined quantization.

Figure 6:
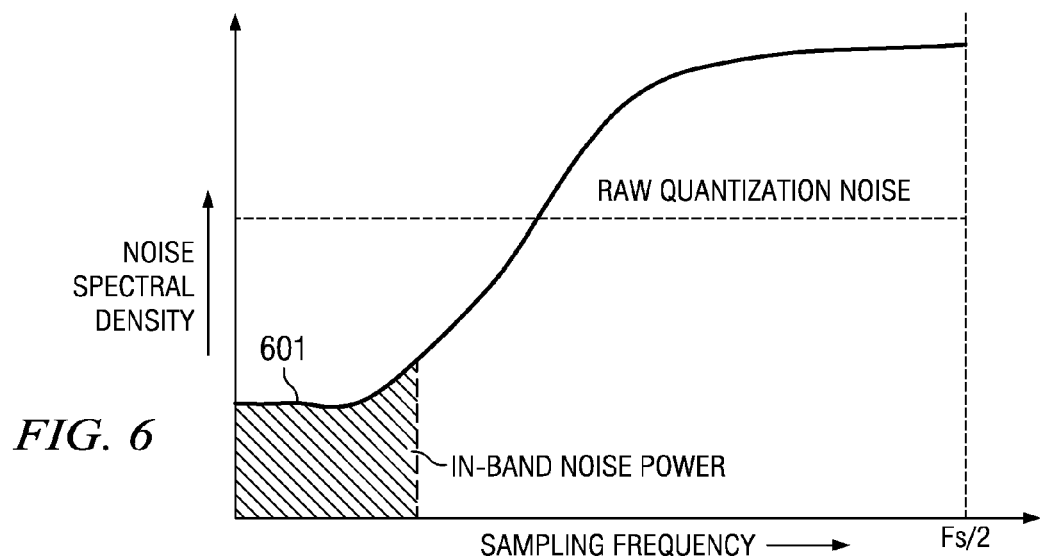
FIG. 6 illustrates the effect of noise-shaping on noise power of a digitally converted analog signal in a frequency band of interest.

The design of a delta-sigma modulator requires consideration of various issues to implement a practical device. One issue for consideration is noise superimposed by the modulator on the output signal. The noise sensitivity to internal processing stages of a delta-sigma modulator, particularly the noise sensitivity to low-frequency noise sources, is typically high for front-end signal processing elements in a delta-sigma modulator. FIG. 6 illustrates the reduction of noise power 601 in a frequency band of interest by noise shaping in a delta-sigma modulator.

Figure 7:
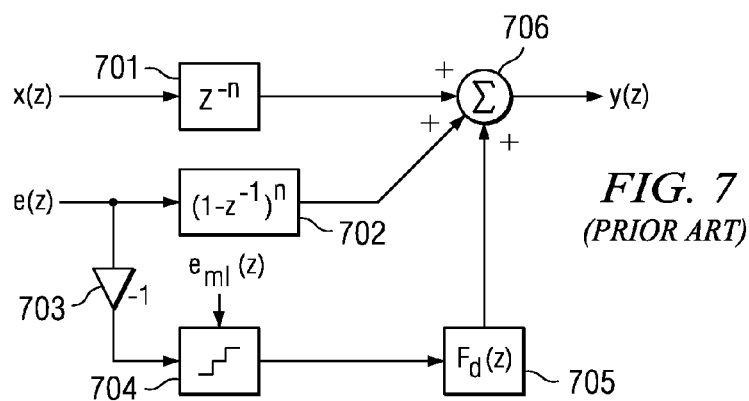
FIG. 7 illustrates a basic multi-bit delta-sigma topology with single-bit feedback of the prior art.

The topology reported in Leslie and Singh, cited above, has been extended by first considering a basic multi-bit delta-sigma topology of the prior art with single-bit feedback as illustrated in the signal flow diagram of FIG. 7. As illustrated in FIG. 7, an analog input signal x(z) is coupled to an A/D converter employing a delta-sigma topology to produce a digital output signal y(z), where the variable "z" represents the sampled-data transform variable as generally recognized in the art. The analog input signal is effectively processed through an n-stage delay represented by block 701. The internal quantization error, represented by the signal e(z), is processed through block 702. The internal quantization error is also processed through the sequence of blocks 703, quantizer 704, and signal processing block 705, before it is summed in block 706 with the processed analog input signal and the signal path through block 702. The final output yields the result $$y(z)=x(z)z^{-n}+e(z)(1-z^{-1})^n+\{e_m(z)-e(z)\}F_d(z) \tag{1}$$

The coarse quantizer error e(z) as represented in the signal flow diagram of FIG. 7 can be canceled by choosing $F_d(z)$ in block 705 to be equal to $(1-z)^n$, i.e., the digital filter function $F_d(z)$ is made equivalent to the noise transfer function ("NTF").

Figure 8:
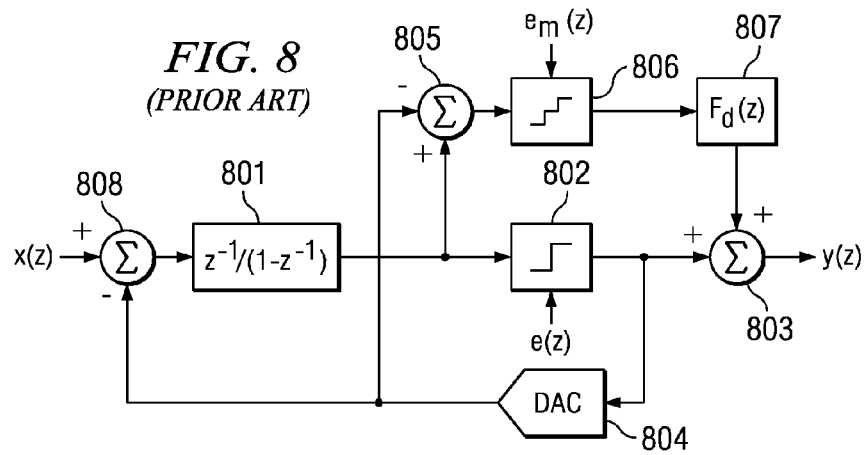
FIG. 8 illustrates an exemplary first order delta-sigma modulator with single-bit feedback of the prior art.

Turning now to FIG. 8 illustrated is an exemplary first order delta-sigma modulator of the prior art with single-bit feedback corresponding to the signal flow diagram illustrated in FIG. 7, where $F_d=(1-z^{-1})^n$. Analog input signal x(z) is coupled to summer 808, the output of which is processed through block 801. The term $z^{-1}$ in the numerator of block 801 represents a one-cycle delay, and the function $(1-z^{-1})$ in the denominator represents integration. The output of block 801 is applied to one-bit quantizer 802, shown generating internal quantization error e(z). The output of block 802 is applied to digital-to-analog converter 804, the analog output of which is subtracted from the analog input signal x(z) to generate the difference signal which is applied to block 801. The output of the digital-to-analog converter represented by block 804 is subtracted from the output of block 805, and the difference is quantized in multi-bit quantizer 806. The multi-bit quantization error generated by block 806 is represented by the multi-bit quantization noise signal $e_m(z)$. The quantized output from block 806 is processed in block 807 and added in summer 803 to the output of one-bit quantizer 802 to produce the digitized result represented by the digital output signal y(z), responding to DAC conversion of analog input signal x(z). The analog-to-digital converter illustrated in FIG. 8 provides substantial quantization noise in the output signal y(z) and requires substantial precision in multi-bit quantization block 806.

Figure 9:
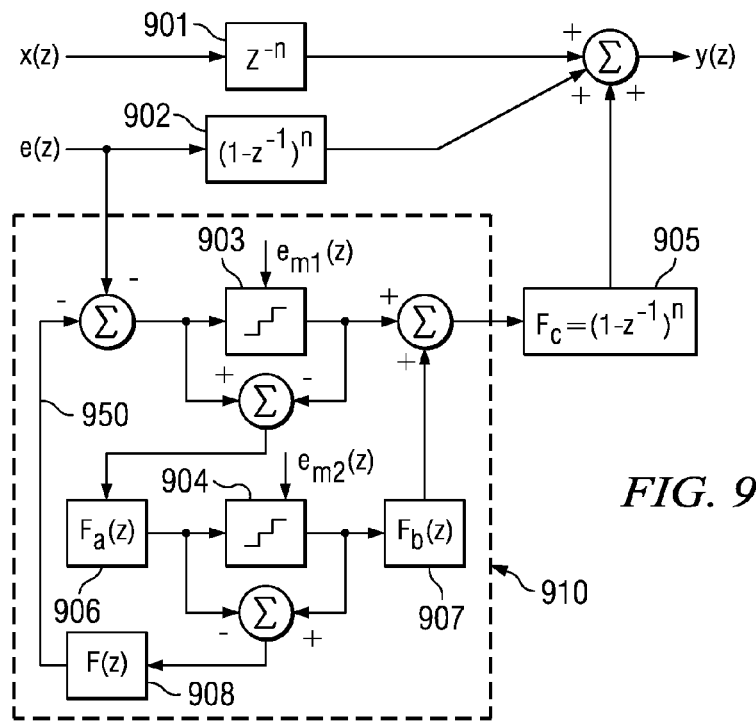
FIG. 9 illustrates a signal flow diagram for a pipelined analog-to-digital converter modulator with cascaded stage filtering and feedback, constructed in accordance with the principles of the present invention.

The analog-to-digital conversion topology as described above can be improved in an embodiment of the present invention described now with reference to FIG. 9, illustrating a signal flow diagram for an $n^{th}$ order pipelined ADC modulator with cascaded stage filtering and feedback. The ADC modulator illustrated in FIG. 9 includes a pipelined quantizer 910. The pipelined quantizer 910 further includes analog signal noise-shaping filtering blocks 906, 908, and digital filters 905 and 907 which may be selectively chosen in an embodiment of the present invention to shape or otherwise reduce output signal quantization noise. The ADC modulator further includes delay block 901, filtering block 902, and quantizers 903 and 904. The signal on node 950 represents the result of noise shaping of quantization error produced by quantizer 904. The ADC output signal y(z) is represented by equation (2) below, $$y(z)=x(z)\cdot z^{-n}+e(z)\cdot(1-z^{-1})^n+[e_{m1}(z)\cdot(1-F_a\cdot F_b)+e_{m2}(z)\cdot(F_b-F)-e(z)]\cdot(1-z^{-1})^n \quad (2)$$

where e(z) represents internal quantization error of the ADC, and $e_{m1}$ and $e_{m2}$ represent, respectively, quantization noise associated with the internal quantizer to which each is coupled. From the equation above for y(z), the new topology introduces several design options for quantization noise cancellation and higher-order noise shaping. The choice of these noise-shaping filters depends on practical considerations, such as ease of implementation, sensitivity of noise cancellation to analog circuit non-idealities, and dynamic range.

If the filtering transfer function $F_a(z)$ is equal to $1/F_b(Z)$, the quantization noise components e(z) and $e_{m1}(z)$ are canceled, as indicated by equation (2) for y(z). The equation for the output signal y(z) then becomes $$y(z)=x(z)\cdot z^{-n}+e_{m2}(z)\cdot[F_b(z)-F(z)]\cdot(1-z^{-1})^n \quad (3)$$

which now does not include noise components due either to e(z) or to $e_{m1}$.

Figure 10:
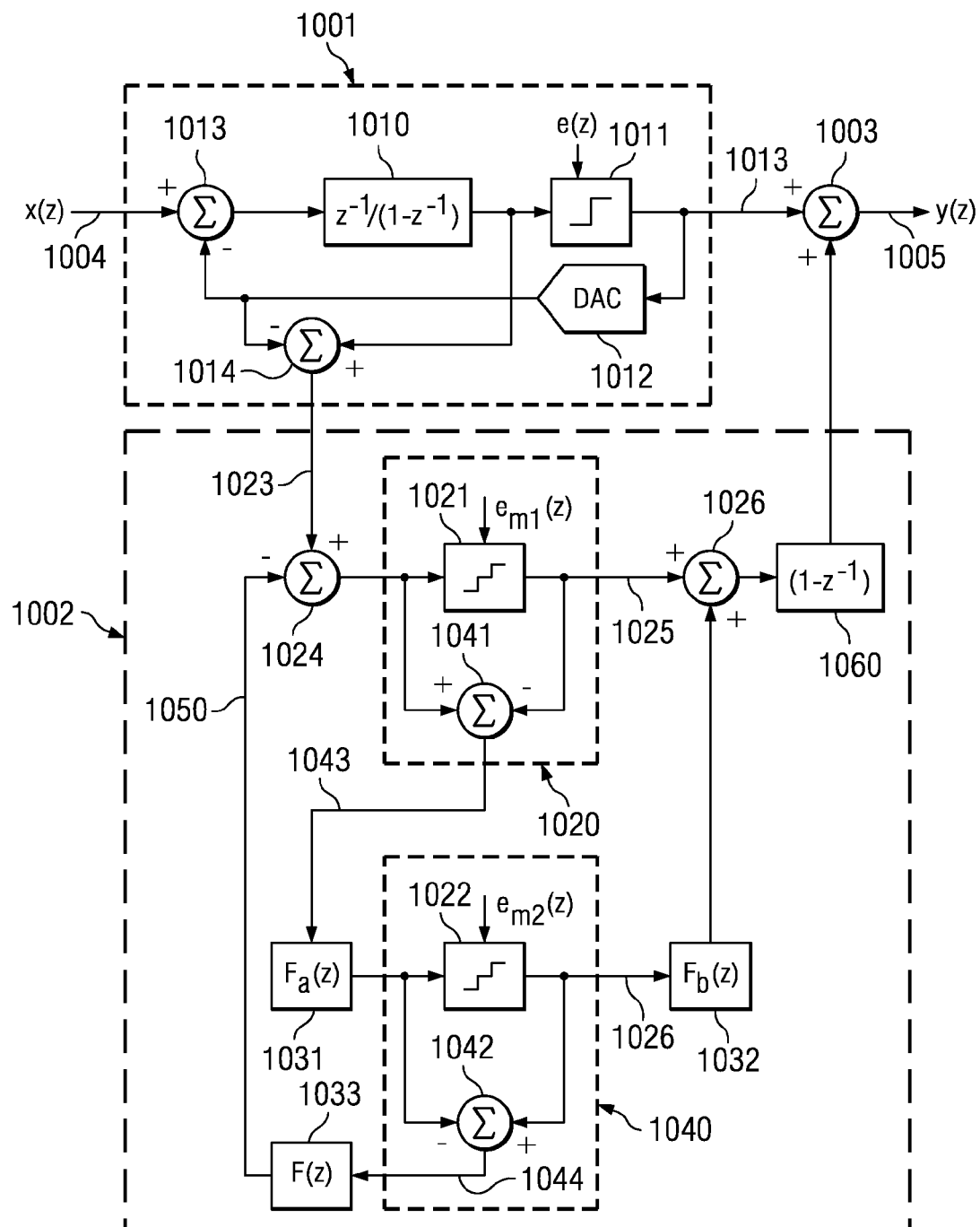
FIGS. 10 and 11 illustrate an analog-to-digital converter including delta-sigma modulators, constructed in accordance with the principles of the present invention.

Turning now to FIG. 10, illustrated is an embodiment of the present invention that includes an analog-to-digital converter including delta-sigma modulators, one of which performs pipelined multi-bit quantization. The analog-to-digital converter includes a first delta-sigma modulator 1001 and a second multi-stage delta-sigma modulator 1002, the second multi-stage modulator including a pipelined noise-shaping filter F(z) in feedback block 1033. An analog input signal x(z) is coupled to input node 1004, and a digital output signal y(z) corresponding to the analog input signal x(t) is produced at output node 1005. The first quantization stage is a classical first-order delta-sigma modulator. The first quantization stage 1001 includes n-stage integrator 1010 and one-bit quantizer 1011, with its quantization noise represented by the noise signal e(z). A one-bit digital-to-analog converter 1012 feeds the quantized input signal back to summer 1013, which couples the difference between the analog input signal x(z) and an analog signal representing the initially quantized input signal to the filtering block 1010. The result is quantization of input signal x(z) for the most significant bit, which is produced as an output signal from quantizer 1011, and which is coupled on node 1013 to combiner 1003. A first quantization error signal 1023 for the first delta-sigma modulator is produced by summer 1014.

The use of a one-bit converter for the first delta-sigma modulator eliminates nonlinearities inherent in multi-bit converters, which generally require a calibration step or other correction techniques to produce an accurate quantization result.

The residual analog signal to be quantized next, represented by the first quantization error signal 1023, is coupled to second multi-stage delta-sigma modulator 1002. The second delta-sigma modulator 1002 includes first quantization stage 1020 including first quantizer 1021, which quantizes the next m1 most significant bits, and second quantization stage 1040 including second quantizer 1022, which quantizes the m2 least significant bits. Quantization noise signals generated by quantizers 1021 and 1022 are illustrated in FIG. 10 as noise signals $e_{m1}(z)$ and $e_{m2}(z)$, respectively. Noise-shaping filters in blocks 1031, 1032, and 1033, represented by filter functions $F_a(z)$, $F_b(z)$, and F(z), respectively, are included in feedback and feedforward loops of the second quantization stage. In particular, the signal at node 1050 represents the result of noise shaping of quantization error produced by quantizer 1022. Summers 1041 and 1042 produce second and third quantization error signals 1043 and 1044, respectively, and are coupled respectively between the inputs and outputs of quantizers 1021 and 1022. The output of summer 1041 at node 1043 represents a first stage quantization error described herein as a second quantization error signal. The output of summer 1042 at node 1044 represents a second stage quantization error, described herein as a third quantization error signal. The noise-shaping filter represented by the filter transfer function F(z) in block 1033 filters the difference signal at node 1044, producing a filtered difference signal at node 1050. The filtered difference signal at node 1050 is subtracted from the first quantization error signal produced on node 1023 to produce an input signal for the first quantizer 1021 in the second quantization stage.

The conversion results of the first quantization stage 1020 and the second quantization stage 1040 are combined in adder 1026, and filtered in noise-shaping filtering block 1060 to produce the conversion results of the second multi-stage delta-sigma modulator. The conversion results of the first delta-sigma modulator and the second multi-stage delta-sigma modulator are added in combiner 1003 to produce the output signal y(z) at node 1005.

Quantizer 1021, in a preferred embodiment of the invention, is constructed as a pipelined ADC to produce accurate quantization of the next m1 bits of the output signal y(z) that follow the first quantized bit produced by the first delta-sigma modulator 1001.

To achieve overall third-order noise shaping in the delta-sigma modulator illustrated in FIG. 10, the filtering function $F_a(Z)$ is set preferably to a constant gain k, and the filtering function $F_b(Z)$ is set to the reciprocal of this value, i.e., 1/k, where k is an inter-stage gain, and is usually set to a value less than or equal to $2^{m1}$, where m1 is the resolution of the first quantizer in the pipeline, i.e., that of quantizer 1021, which produces quantization noise signal $e_{m1}(z)$. By also choosing the filtering function F(z) in block 1033 to be equal to $z^{-1} \cdot (2-z^{-1})/k$, the following equation results for the output signal y(z), including its noise content, which advantageously does not include noise components due to e(z) and $e_{m2}(z)$, leaving only noise components due to quantization noise $e_{m1}(z)$:

$$y(z)=x(z)\cdot z^{-1}+e_{m1}(z)\cdot(1-z^{-1})^3/k. \quad (4)$$

The delay function in F(z), i.e., the numerator factor $z^{-1}$, is implemented by default using the pipelined latency of the second quantizer in the pipeline, i.e., in quantizer 1022 which produces quantization noise signal $e_{m2}(z)$, without implementing additional hardware. As implied by equation (3), higher-order noise-shaping can be obtained by increasing both n (the order of integration illustrated in block 1010) and the order of the [$F_b(z)$-$F(z)$] term. The analog filters $F_b(z)$ and $F(z)$ are chosen to maintain loop stability and relative ease of implementation. The result of these filtering selections for an analog-to-digital converter including delta-sigma modulators and pipelined multi-bit quantization is illustrated in FIG. 11, employing the same reference designations used in FIG. 10.

Figure 11:
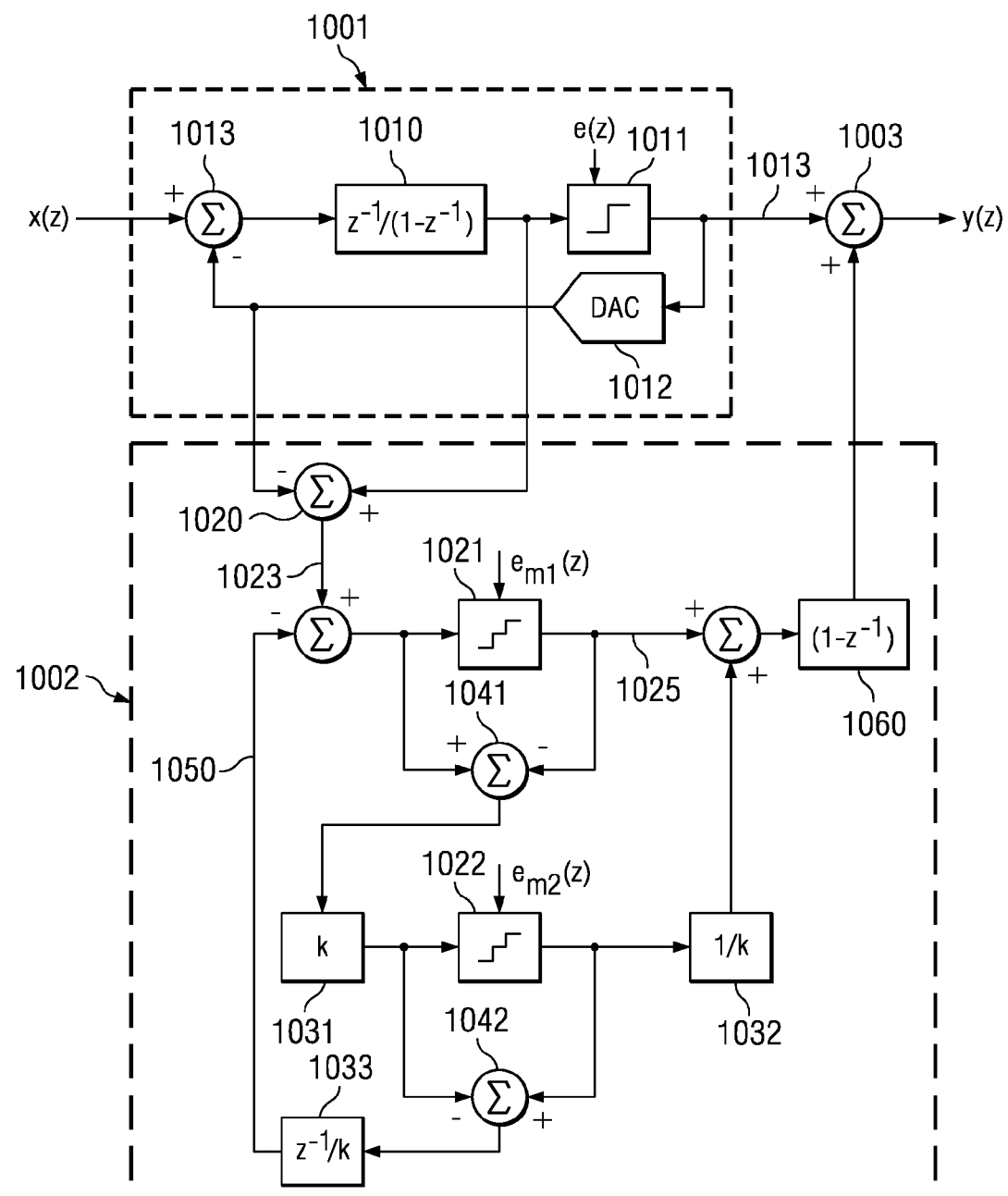

The topology illustrated in FIGS. 10 and 11 is relatively tolerant of analog circuit inaccuracies, since mismatches arising out of the multi-bit quantizers, analog filters, and subtracters, as illustrated in FIGS. 10 and 11, are each in a path that is high-pass filtered by the filtering function $F_c(z)$, such as illustrated by block 905 in FIG. 9. Thus, any mismatched error is shaped by the $(1-z^{-1})^n$ filtering function. This implies that no dynamic element matching is necessary in the second stage. If necessary, residual analog circuit nonidealities may be calibrated using known methods, e.g., as described by P. Kiss, et al., in the paper entitled "Adaptive Digital Correction of Analog Errors in MASH ADCs, Part II: Correction Using Test-Signal Injection," IEEE Transactions on Circuits and Systems, II, Vol. 47, No. 3, pp 185-196, March, 2000, and the paper by A. Bosi, et al., entitled "An 80 MHz 4×Oversampled Cascaded Delta-Sigma Pipelined ADC with 75 dB DR and 87 dB SFDR," International Solid State Circuits Conference, February 2005, pp. 174-175, both of which are hereby referenced and incorporated herein.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, and utilization of techniques to form the processes and systems providing efficient implementation of a delta-sigma modulator with simplified digital computation as described herein may be varied while remaining within the broad scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An analog-to-digital converter, comprising:
   a first delta-sigma modulator configured to quantize a most significant bit of an input signal and produce a first quantization error signal, the first delta-sigma modulator comprising:
      a one-bit analog-to-digital converter in a feedforward path, and
      a one-bit digital-to-analog converter and a feedback path; and
   a second multi-stage delta-sigma modulator configured to quantize less significant bits of said input signal, the second multi-stage delta-sigma modulator comprising:
      a first quantization stage coupled to a difference of said first quantization error signal and a second quantization error signal and configured to quantize next most significant bits of said input signal and produce a third quantization error signal representing a difference between an input and an output of said first quantization stage;
      a second quantization stage with an input coupled to said third quantization error signal and configured to quantize least significant bits of said input signal and produce said second quantization error signal representing a difference between said input and an output of said second quantization stage; and
      a first noise-shaping filter coupled to said second quantization error signal, the output of said first noise-shaping filter subtracted from said first quantization error signal to produce said input of said first quantization stage.

2. The analog-to-digital converter according to claim 1, wherein said second multi-stage delta-sigma modulator includes pipelined quantization stages.

3. The analog-to-digital converter according to claim 1, wherein said most significant bit produced by said first delta-sigma modulator and said less significant bits produced by said second multi-stage delta-sigma modulator are added in a first combiner to produce an output signal.

4. The analog-to-digital converter according to claim 3, wherein said less significant bits are filtered in a second noise-shaping filter prior to being added to said most significant bit in said first combiner.

5. The analog-to-digital converter according to claim 1, wherein said third quantization error signal is filtered in a third noise-shaping filter prior to being coupled to said second quantization stage.

6. The analog-to-digital converter according to claim 1, wherein said next most significant bits produced in said first quantization stage and said least significant bits produced in said second quantization stage are combined in a second combiner to produce said less significant bits produced by said second multi-stage delta-sigma modulator.

7. The analog-to-digital converter according to claim 6, wherein least significant bits quantized by said second quantization stage are filtered by a fourth noise-shaping filter prior to combining them in said second combiner.

8. The analog-to-digital converter according to claim 7, wherein the filtering function in said third noise-shaping filter and the filtering function in said fourth noise-shaping filter are reciprocal functions.

9. The analog-to-digital converter according to claim 7, wherein said filtering function of said third noise-shaping filter comprises a constant, said filtering function of said fourth noise-shaping filter comprises the reciprocal of the constant, and said first noise-shaping filter comprises the filtering function $z^{-1}$ divided by the constant.

10. A method of constructing an analog-to-digital converter, the method comprising:
   receiving an input signal;
   converting said input signal to a one-bit digital signal representing a most significant bit of said input signal with a first delta-sigma modulator including a one bit analog-to-digital converter in a feedforward path and a one-bit digital-to-analog converter in a feedback path;
   producing a first quantization error signal resulting from converting said input signal to said one bit digital signal in said first delta-sigma modulator;
   quantizing less significant bits of said input signal in a first stage and a second stage of a second multi-stage delta-sigma modulator, said quantizing comprising:

quantizing next most significant bits of said input signal in a first quantization stage of said second multi-stage delta-sigma modulator using a difference of said first quantization error signal and a second quantization error signal;

producing a third quantization error signal representing a difference between an input and an output of said first quantization stage of said second multi-stage delta-sigma modulator;

quantizing in a second quantization stage of said second multi-stage delta-sigma modulator least significant bits of said input signal with an input coupled to said third quantization error signal;

producing the second quantization error signal representing a difference between said input of said second quantization stage and an output of said second quantization stage of said second multi-stage delta-sigma modulator, and coupling a first noise-shaping filter to said second quantization error signal, and subtracting an output of said first noise-shaping filter from said first quantization error signal to produce said input of said first quantization stage of said second multi-stage delta-sigma modulator.

11. The method as claimed in claim 10, wherein said second quantization stage includes pipelined quantization stages.

12. The method as claimed in claim 10, further including adding said most significant bit produced by said first delta-sigma modulator and said less significant bits produced by said second multi-stage delta-sigma modulator to produce an output signal.

13. The method as claimed in claim 12, further including filtering said less significant bits in a second noise-shaping filter prior to adding said less significant bits to said most significant bit.

14. The method as claimed in claim 10, further including filtering said third quantization error signal in a third noise-shaping filter prior to coupling said third quantization error signal to said second quantization stage.

15. The method as claimed in claim 10, further including combining said next most significant bits produced in said first quantization stage and said least significant bits produced in said second quantization stage to produce said less significant bits produced by said second multi-stage delta-sigma modulator.

16. The method as claimed in claim 15, further including filtering said least significant bits quantized by said second quantization stage by a fourth noise-shaping filter prior to combining them.

17. The method as claimed in claim 16, further including using reciprocal filtering functions in said third noise-shaping filter and said fourth noise-shaping filter.

18. The method as claimed in claim 16, wherein said filtering function of said third noise-shaping filter comprises a constant, said filtering function of said fourth noise-shaping filter comprises the reciprocal of the constant, and said first noise-shaping filter comprises filtering function $z^{-1}$ divided by the constant.

* * * * *